(12) United States Patent
Ohmi et al.

(10) Patent No.: US 12,306,022 B2
(45) Date of Patent: May 20, 2025

(54) POSITION SENSOR

(71) Applicants: DENSO CORPORATION, Kariya (JP); HONDA MOTOR CO., LTD., Tokyo (JP)

(72) Inventors: Tetsuya Ohmi, Kariya (JP); Michihiro Makita, Kariya (JP); Masahiko Akiyama, Tokyo (JP); Masashi Misawa, Tokyo (JP); Kenshi Masuo, Tokyo (JP)

(73) Assignees: DENSO CORPORATION, Kariya (JP); HONDA MOTOR CO., LTD., Tokyo (JP)

( * ) Notice: Subject to any disclaimer, the term of this patent is extended or adjusted under 35 U.S.C. 154(b) by 132 days.

(21) Appl. No.: 18/302,083

(22) Filed: Apr. 18, 2023

(65) Prior Publication Data

US 2023/0258474 A1 Aug. 17, 2023

Related U.S. Application Data

(63) Continuation of application No. PCT/JP2021/039509, filed on Oct. 26, 2021.

(30) Foreign Application Priority Data

Nov. 2, 2020 (JP) ................................. 2020-183435

(51) Int. Cl.
*G01D 5/16* (2006.01)
*F16H 59/04* (2006.01)
(Continued)

(52) U.S. Cl.
CPC ............. *G01D 5/16* (2013.01); *F16H 59/044* (2013.01); *G01D 5/147* (2013.01); *G01R 33/091* (2013.01); *G01R 33/0023* (2013.01)

(58) Field of Classification Search
CPC ........ G01D 5/16; G01D 5/147; F16H 59/044; F16H 59/70; F16H 2061/1284; F16H 59/105; G01R 33/091; G01R 33/0023
(Continued)

(56) References Cited

U.S. PATENT DOCUMENTS

| 2013/0021023 A1* | 1/2013 | Niwa | G01D 5/202 |
| | | | 324/207.15 |
| 2015/0130452 A1* | 5/2015 | Nishioka | G01D 5/147 |
| | | | 324/207.25 |

(Continued)

*Primary Examiner* — Raul J Rios Russo
(74) *Attorney, Agent, or Firm* — Posz Law Group, PLC

(57) ABSTRACT

A detecting unit generates detection signals corresponding to a plurality of ranges aligned in one direction along a moving direction of a detection body, based on a change in the magnetic field constantly received by a detecting element from the detection body. A signal processing unit acquires a detection signal from the detecting unit, compares the detection signal with a threshold value, and identifies a position of the detection body as a position of any one of a plurality of ranges based on a combination of a magnitude relationship between the detection signal and the threshold value. A detection body has a plurality of region portions corresponding to a plurality of ranges. The plurality of region portions are configured to be connected stepwise in the moving direction of the detection body within a plane of a detection surface facing the detecting unit of the detection body.

6 Claims, 5 Drawing Sheets

(51) Int. Cl.
  *G01D 5/14*  (2006.01)
  *G01R 33/00*  (2006.01)
  *G01R 33/09*  (2006.01)
(58) Field of Classification Search
  USPC .................................................. 324/207.21
  See application file for complete search history.

(56) References Cited

U.S. PATENT DOCUMENTS

| | | |
|---|---|---|
| 2020/0072593 A1 | 3/2020 | Kobayashi et al. |
| 2020/0096367 A1 | 3/2020 | Kitaura et al. |
| 2020/0096368 A1* | 3/2020 | Kobayashi ......... G01D 5/24438 |
| 2021/0359682 A1* | 11/2021 | Faber ................... H03K 17/962 |

* cited by examiner

POSITION SENSOR

CROSS REFERENCE TO RELATED APPLICATIONS

This application is a continuation application of International Patent Application No. PCT/JP2021/039509 filed on Oct. 26, 2021, which designated the U.S. and based on and claims the benefits of priority of Japanese Patent Application No. 2020-183435 filed on Nov. 2, 2020. The entire disclosure of all of the above applications is incorporated herein by reference.

TECHNICAL FIELD

The present disclosure relates to a position sensor.

BACKGROUND

Conventionally, a position sensor that detects the position of a detection body made of a magnetic material has been proposed.

SUMMARY

According to one aspect of the present disclosure, a position sensor includes a detecting unit and a signal processing unit.

The detecting unit has a magnet that generates a bias magnetic field and a detecting element to which the bias magnetic field is applied. The detecting unit generates detection signals corresponding to a plurality of ranges aligned in one direction along a moving direction of the detection body, based on a change in the magnetic field constantly received by the detecting element from the detection body as the detection body made of magnetic material moves.

The signal processing unit acquires a detection signal from the detecting unit, compares the detection signal with a threshold value, and identifies a position of the detection body as a position of any one of a plurality of ranges based on a combination of a magnitude relationship between the detection signal and the threshold value.

The detection body has a plurality of region portions corresponding to a plurality of ranges. The plurality of region portions are configured to be connected stepwise in the moving direction of the detection body within a plane of a detection surface facing the detecting unit of the detection body.

BRIEF DESCRIPTION OF DRAWINGS

The above and other objects, features and advantages of the present disclosure will be more clearly understood from the following detailed description with reference to the accompanying drawings. In the drawings.

DETAILED DESCRIPTION

Figure 1:
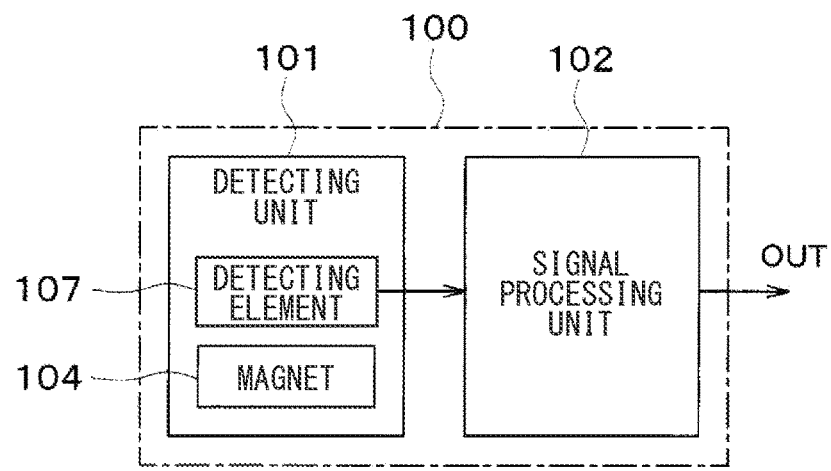
FIG. 1 is a configuration diagram of a position sensor according to a first embodiment.

In an assumable example, a position sensor that detects the position of a detection body made of a magnetic material has been proposed. The detection body is provided with peak portions and valley portions in a moving direction. The position sensor has a detecting unit that detects changes in the magnetic field received from the peak portions and valley portions. The position sensor identifies the position of the peak portion and the position of the valley portion by determining Hi/Lo by comparing a detection signal acquired by the detecting unit and a threshold.

However, in the conventional technique described above, when the valley portion is detected, the magnet inside the detecting unit is not or is not easily affected by the valley portion. For this reason, there is no difference between the detection signal when the detecting unit detects the valley portion and the detection signal when the detection body is missing, or the difference is very small. Therefore, there is a possibility that missing detection body cannot be detected.

A position sensor is capable of determining missing of a detection body.

According to one aspect of the present disclosure, a position sensor includes a detecting unit and a signal processing unit.

The detecting unit has a magnet that generates a bias magnetic field and a detecting element to which the bias magnetic field is applied. The detecting unit generates detection signals corresponding to a plurality of ranges aligned in one direction along a moving direction of the detection body, based on a change in the magnetic field constantly received by the detecting element from the detection body as the detection body made of magnetic material moves.

The signal processing unit acquires a detection signal from the detecting unit, compares the detection signal with a threshold value, and identifies a position of the detection body as a position of any one of a plurality of ranges based on a combination of a magnitude relationship between the detection signal and the threshold value.

The detection body has a plurality of region portions corresponding to a plurality of ranges. The plurality of region portions are configured to be connected stepwise in the moving direction of the detection body within a plane of a detection surface facing the detecting unit of the detection body.

When the detection body is missing, the signal processing unit determines the missing of the detection body by acquiring a detection signal obtained by not receiving any influence of the magnetic field from the detection body.

According to this configuration, the detecting element can acquire a detection signal different from the detection signal based on the influence of the magnetic field received from each region of the detection body. Therefore, it is possible to determine whether the detection body is missing based on the detection signal when the detection object is missing.

Hereinafter, embodiments for implementing the present disclosure will be described referring to drawings. In the respective embodiments, parts corresponding to matters already described in the preceding embodiments are given reference numbers identical to reference numbers of the matters already described. The same description is therefore omitted depending on circumstances. In a case where only a part of the configuration is described in each embodiment, the other embodiments described above can be applied to the other part of the configuration. The present disclosure is not limited to combinations of embodiments which combine parts that are explicitly described as being combinable. As long as no problem is present, the various embodiments may be partially combined with each other even if not explicitly described.

First Embodiment

A first embodiment will be described with reference to the drawings. A position sensor according to the present embodiment is a sensor that detects a range of a position of a detection body and outputs a signal corresponding to that range.

The position sensor detects a position of a movable part, as a detection body, interlocking with a movement of a shift position of a vehicle. The position sensor employs a magnetic detection method. Specifically, the position sensor detects a signal based on a position of a shaft to acquire a state of the shaft.

The state of the shaft means the position of the shaft when a shift position is operated by a user. For example, the shaft is moved in conjunction with a park position of the shift position. When the shift position is operated to be the park position, the shaft is axially moved. The shaft thus reflects the state of the park position. The position sensor detects a position of the shaft corresponding to a park position.

When the shift position is operated to be a position other than the park position, the shaft reflects the state of that shift position other than the park position. In this case, the position sensor detects a position of the shaft other than the position corresponding to the park position. The shaft may be moved in conjunction with a position other than the park position.

The shaft is entirely made of a magnetic material, for example. In the shaft, a surface opposing the position sensor may be made of a magnetic material and other portions may be made of other metal materials.

Figure 2:
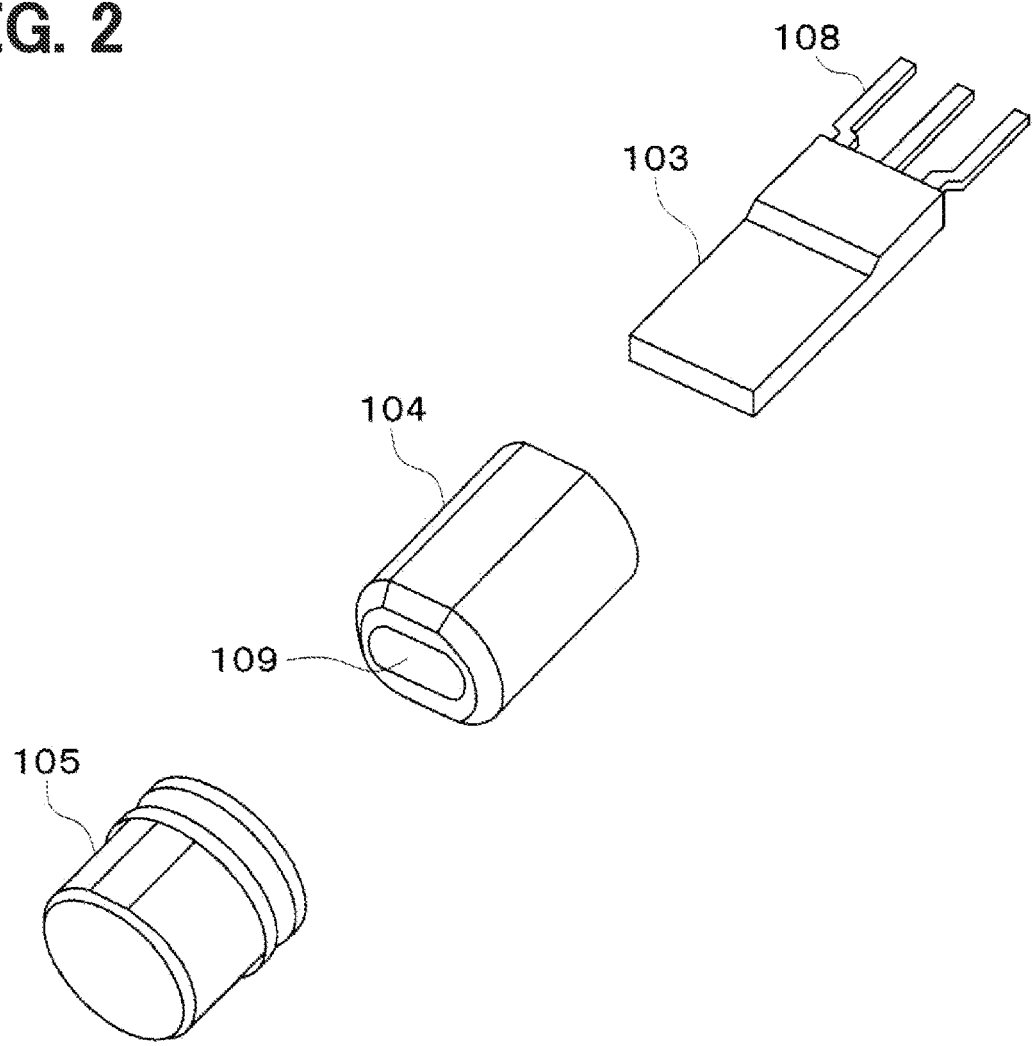
FIG. 2 is an exploded perspective view of the position sensor according to the first embodiment.
Figure 3:
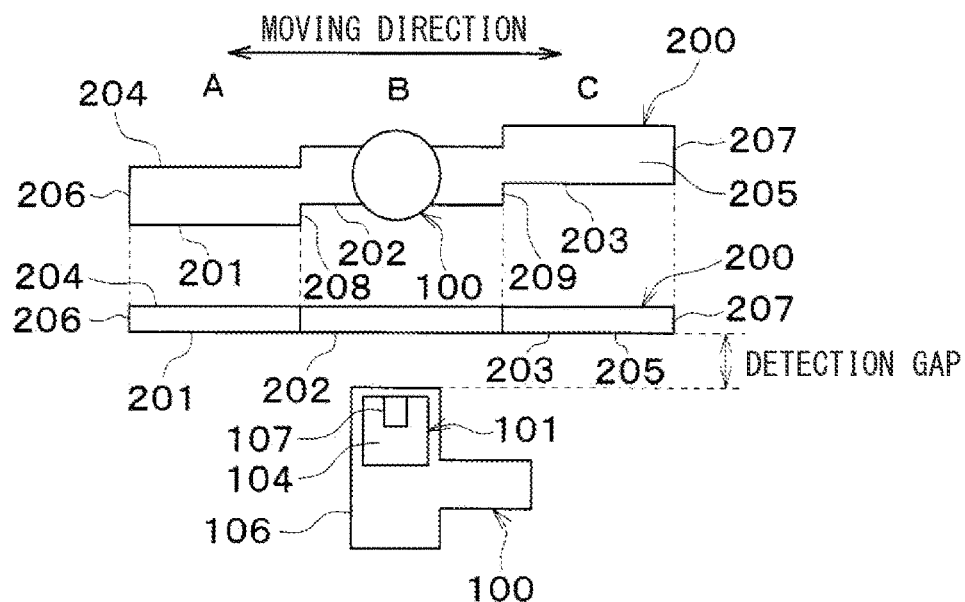
FIG. 3 is a diagram showing a detection body and the position sensor.

As shown in FIGS. 1, 2, and 3, a position sensor 100 includes a detecting unit 101 and a signal processing unit 102. The position sensor 100 also includes a molded IC portion 103, a magnet 104, and a holder 105. These components are housed in a case 106.

The detecting unit 101 generates detection signals corresponding to a plurality of ranges aligned in one direction along a moving direction of a detection body 200, based on a change in the magnetic field constantly received from the detection body 200 as the detection body 200 made of magnetic material moves. The plurality of ranges along a moving direction of the detection body 200 are not arranged in parallel along the moving direction of the detection body 200, but are arranged in series in one direction along the moving direction of the detection body 200.

Here, the detection body 200 has three region portions 201 to 203 corresponding to a plurality of ranges arranged in one direction along the moving direction. Each of the region portions 201 to 203 is configured by a rectangular plate member 204. Each of the region portions 201 to 203 are configured to be connected stepwise in the moving direction of the detection body 200 within a plane of a detection surface 205 facing the detecting unit 101 of the detection body 200. The magnet 104 is placed with a constant detection gap with respect to the detection surface 205.

"Connected stepwise" means that one side and the other side of each of the region portions 201 to 203 are connected in the plane of the detection surface 205 so as to be shifted in a direction perpendicular to the moving direction. As a result, in each of the region portions 201 to 203, both ends along the moving direction, that is, the two long sides form a stepped shape.

As shown in FIG. 3, in the detection body 200, one end in the moving direction is defined as a first end 206 and the other end is defined as a second end 207. A connection portion between the region portion 201 and the region portion 202 is defined as a first edge 208. A connecting portion between the region portion 202 and the region portion 203 is defined as a second edge 209. A position of the region portion 201 is defined as A, a position of the region portion 202 is defined as B, and a position of the region portion 203 is defined as C.

The detection body 200 is formed by pressing a plate member made of a magnetic material. Each of the region portions 201 to 203 may have the same or different length in the moving direction. Further, the lengths of the region portions 201 to 203 in the direction perpendicular to the moving direction within the plane of the detection surface 205 may be the same or may be different. The detection body 200 is fixed to a part such as a shaft. Also, in the detection body 200, the region portions 201 and 203, which are both ends, may be fixed to the shaft.

The detecting unit 101 has a detecting element 107. The detecting element 107 is an element to which a bias magnetic field is applied from the magnet 104 and whose resistance value changes based on changes in the magnetic field received from the detection body 200 as the detection body 200 moves. The detecting element 107 is configured of, for example, a plurality of magnetoresistive element pairs. The magnetoresistive element pair is configured as a half-bridge circuit in which two magnetoresistive units are connected in series.

The magnetoresistive element is, for example, an AMR element (Anisotropic Magneto Resistance; AMR). The detecting element 107 may be a GMR element (Giant Magneto Resistance; GMR) or a TMR element (Tunneling Magneto Resistance; TMR).

The detecting element 107 is configured as one chip. The signal processing unit 102 is configured as one semiconductor chip. These chips are mounted on a lead frame 108 and molded with mold resin so that the lead portions are exposed, thereby forming the molded IC portion 103. The molded IC portion 103 and the magnet 104 are housed in the case 106.

The magnet 104 is a component that generates a bias magnetic field and constitutes a part of the detecting unit 101. The magnet 104 has a flat tubular shape with a hollow portion 109. The flat tubular shape refers to a shape having a rectangular outer peripheral shape and a similarly rectangular through-hole formed in a central portion. The flat tubular shape can also be said to be a flat square tubular shape. A part of the molded IC portion 103 is inserted into the hollow portion 109 of the magnet 104. Thereby, the detecting element 107 is housed in the hollow portion 109 of the magnet 104. The magnet 104 is inserted into the holder 105 formed in a cylindrical shape with a bottom.

The signal processing unit 102 acquires a detection signal from the detecting element 107 of the detecting unit 101, compares the detection signal with a threshold value, and identifies a position of the detection body 200 as a position of any one of a plurality of ranges based on a combination of a magnitude relationship between the detection signal and the threshold value. When the detection body 200 is missing, the signal processing unit 102 determines the missing of the detection body 200 by acquiring a detection signal obtained by not receiving any influence of the magnetic field from the detection body 200.

The signal processing unit 102 has a threshold value corresponding to each range with respect to the detection signal and a threshold value for determining the detection signal corresponding to the missing of the detection body 200. The signal processing unit 102 generates an output signal corresponding to position determination, and outputs the output signal to an external device.

Figure 4:
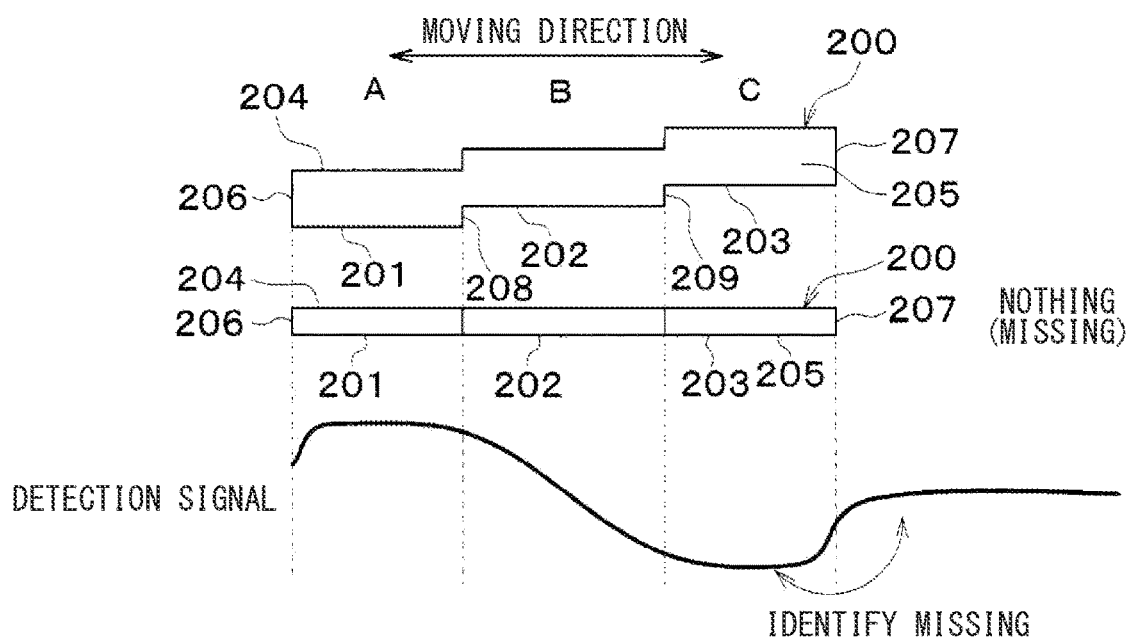
FIG. 4 is a diagram showing a detection signal based on a positional relationship between a detection body and a position sensor.

Next, a position determination of the detection body 200 will be described. As shown in FIGS. 3 and 4, when the detection body 200 moves along the moving direction with respect to the detecting unit 101, the detection signal has waveforms corresponding to each of the region portions 201 to 203.

Each of the region portions 201 to 203 of the detection body 200 are arranged at positions shifted from the moving direction on the detection surface 205. Therefore, the influence of the magnetic field that the detecting unit 101 receives from each of the region portions 201 to 203 differs for each of the region portions 201 to 203. Therefore, the detection signal differs for each of the region portions 201 to 203.

Then, when the detection body 200 moves normally, the position determination is performed as follows. First, from the first end 206 to the first edge 208 of the detection body 200, the detection signal has the highest value. The position determination in this case is referred to as "A".

From the first edge 208 to the second edge 209 of the detection body 200, the detection signal has a lower value than that in the position A. The position determination in this case is referred to as "B".

From the second edge 209 to the second end 207 of the detection body 200, the detection signal has the lowest value with respect to that in the position A and the position B. The position determination in this case is referred to as "C".

Subsequently, if the detection body 200 is missing for some reason, the detecting element 107 will not receive any change in the magnetic field from the detection body 200. This is a state in which the detection surface 205 of the detection body 200 and the magnet 104 are not arranged to face each other. As a result, the detection signal converges to a value different from the value when the detecting unit 101 is affected by the magnetic fields from the region portions 201 to 203. That is, the detection signal converges to a value that is not affected by the magnetic field.

Therefore, when the detection body 200 is missing, since the difference between the detection signal of the region portion 203 corresponding to the position C and the detection signal in a state where the detection body 200 is missing, the signal processing unit 102 can identify the missing of the detection body 200. Although not shown, the signal processing unit 102 can also identify the missing of the detection body 200, since the difference between the detection signal of the region portion 201 corresponding to the position A and the detection signal in a state where the detection body 200 is missing.

Therefore, when the detection body 200 is missing, the signal processing unit 102 can specify "missing" as the position determination. In addition, the external device can recognize that an abnormality has occurred in the detection body 200.

Figure 5:
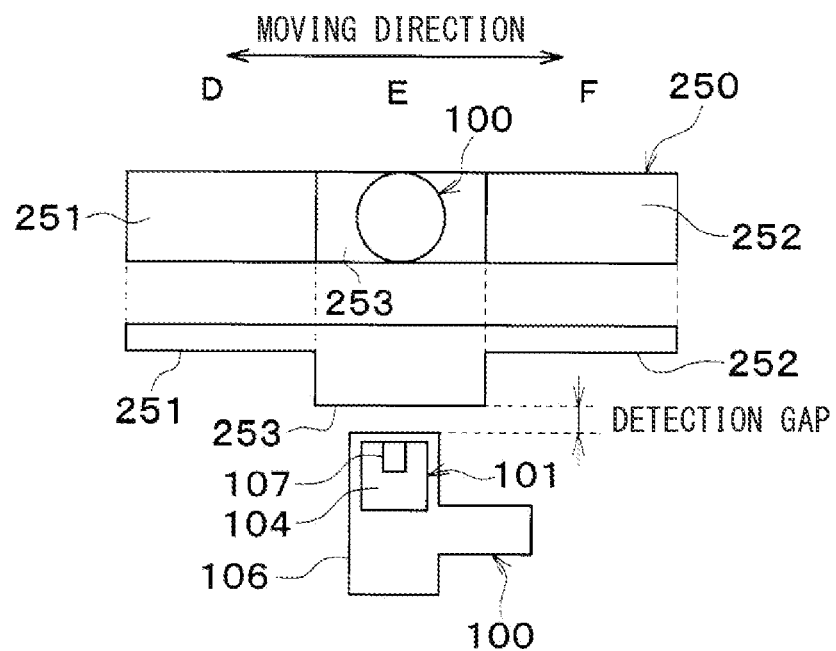
FIG. 5 is a diagram showing a detection body and a position sensor according to a comparative example.

As a comparative example for the above position determination, as shown in FIG. 5, a detection body 250 to be compared has a shape in which two valley portions 251 and 252 sandwich a peak portion 253. A position of the valley portion 251 is referred to as D, a position of the peak portion 253 is referred to as E, and a position of the valley portion 252 is referred to as F.

Figure 6:
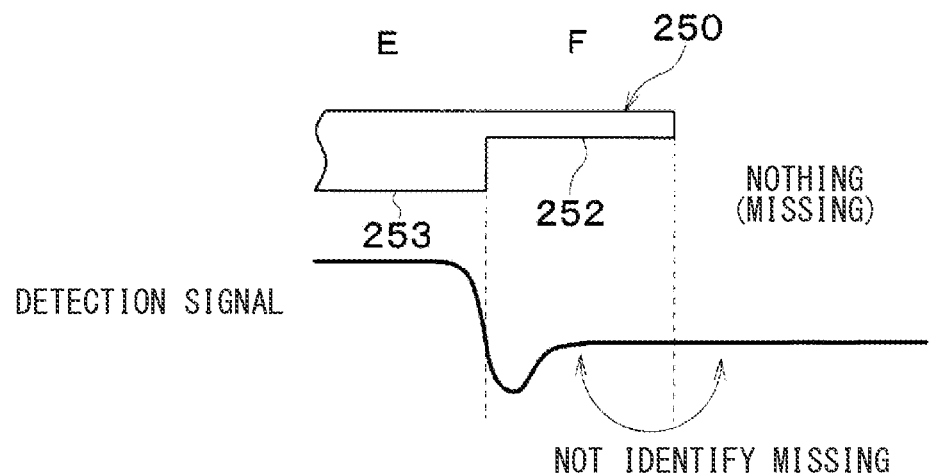
FIG. 6 is a diagram showing a detection signal based on a positional relationship between the detection body and the position sensor in the comparative example.

As shown in FIGS. 5 and 6, when the detecting unit 101 is arranged to face the peak portion 253, the detection gap becomes small. Therefore, the detection signal has a large value. The position determination in this case becomes "E".

On the other hand, when the detecting unit 101 is arranged to face the valley portions 251 and 252, the detection gap becomes large. Therefore, since the detecting unit 101 is not affected by the magnetic field from the valley portions 251 and 252, the detection signal converges to a value that is not affected by the magnetic field. The position determination in this case becomes "D" or "F".

On the other hand, when the detection body 200 is missing, the detection gap between the detecting unit 101 and the detection body 250 becomes large. That is, the detecting unit 101 is completely unaffected by the magnetic fields from the peak portion 253 and valley portions 251 and 252 of the detection body 250. That is, it is the same as the state in which the detecting unit 101 is arranged to face the valley portions 251 and 252. Therefore, the detection signal converges to a value that is not affected by the magnetic field.

Therefore, the position determination becomes "D" or "F" even though the detection body 200 is missing. When the position determination when the detection body 200 is missing becomes "D" or "F", there is a possibility that it is erroneously determined to be the position of the valley portions 251 and 252. Therefore, the external device cannot grasp whether an abnormal state has occurred.

As described above, even if the detecting element 107 is in a state where the detecting element 107 is not affected by the magnetic field from the detection body 200 due to the missing of the detection body 200, the detection signal that is different from the detection signal based on the influence of the magnetic field received from the detection body 200 can be obtained. Therefore, it is possible to determine whether the detection body 200 is missing based on the detection signal when the detection body 200 is missing.

Second Embodiment

Figure 7:
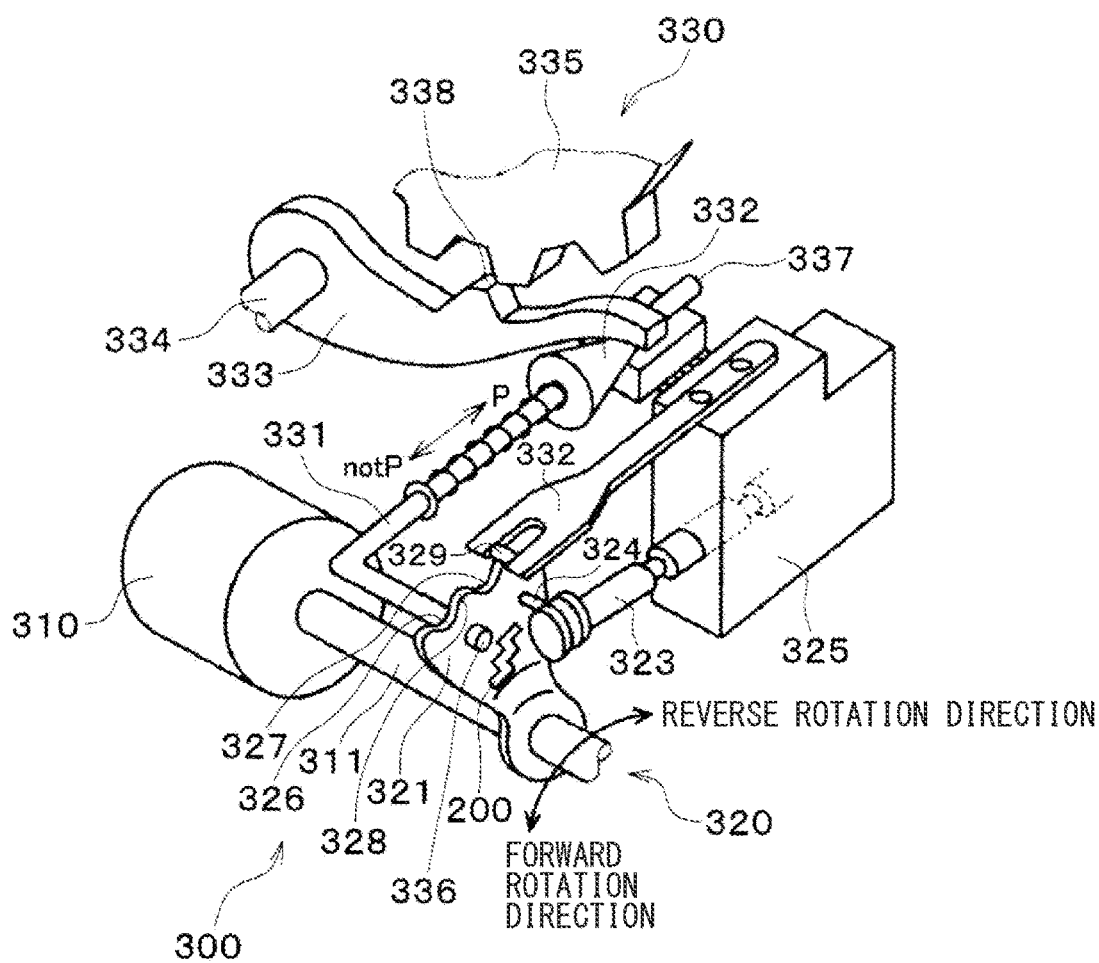
FIG. 7 is a perspective view showing a shift range switching system according to a second embodiment.

In the present embodiment, the configurations different from those of the first embodiment will be mainly described. In the present embodiment, as shown in FIG. 7, the detection body 200 is provided in a shift range switching system 300 that switches the shift range of the vehicle. A shift range switching system 300 includes a motor 310, a shift range switching mechanism 320, and a parking lock mechanism 330.

The motor 310 rotates when power is supplied from a battery mounted on the vehicle (not shown). The motor 310 is a drive source for the shift range switching mechanism 320. The motor 310 is a switched reluctance motor. The motor 310 may be of any type, such as a DC motor.

A speed reducer (not shown) is provided between a motor shaft of the motor 310 and an output shaft 311. The speed reducer reduces the speed of rotation of the motor 310 and outputs the reduced speed to the output shaft 311. The rotation of the motor 310 is thus transmitted to the shift range switching mechanism 320.

The shift range switching mechanism 320 has a detent plate 321, a detent spring 322 as an urging member, and the like. The shift range switching mechanism 320 transmits a rotational driving force, which is outputted from the speed reducer, to a manual valve 323 and the parking lock mechanism 330.

The detent plate 321 is a movable component fixed to the output shaft 311 and driven by the motor 310. In the present embodiment, a direction in which the detent plate 321 is separated from the base of the detent spring 322 is defined as a forward rotation direction, and a direction in which the detent plate 321 approaches the base is defined as a reverse rotation direction.

The detent plate 321 has a pin 324 protruding in parallel with the output shaft 311. The pin 324 is connected to the manual valve 323. The detent plate 321 is driven by the motor 310, whereby the manual valve 323 reciprocates in an axial direction. That is, the shift range switching mechanism 320 converts the rotational motion of the motor 310 into a linear motion and transmits the linear motion to the manual valve 323.

The manual valve 323 is provided on a valve body 325. When the manual valve 323 reciprocates in the axial direction, a hydraulic supply path to a hydraulic clutch (not shown) is switched, and an engagement state of the hydraulic clutch is switched. In this way, the shift range is switched.

A first valley portion 326, a second valley portion 327, and a peak portion 328 formed between the two valley portions 326 and 327 are provided on the detent spring 322 side of the detent plate 321. Of the two valley portions 326 and 327, the side closer to the base of the detent spring 322 is called the second valley portion 327 and the farther side is called the first valley portion 326. The first valley portion 326 corresponds to a P range, and the second valley portion 327 corresponds to a not P range other than the P range.

The detent spring 322 is a resiliently deformable plate-like member provided with a detent roller 329 at a tip end. The detent roller 329 is an engaging member. The detent spring 322 urges the detent roller 329 toward a rotation center of the detent plate 321. When a rotational force equal to or greater than a predetermined force is applied to the detent plate 321, the detent spring 322 is elastically deformed, and the detent roller 329 moves between the first valley portion 326 and the second valley portion 327.

The detent roller 329 is fitted in one of the first and second valley portions 326 and 327, the pivoting motion of the detent plate 321 is restricted. Thereby, the axial position of the manual valve 323 and the state of the parking lock mechanism 330 are determined, and the shift range of the automatic transmission (not shown) is fixed. The detent roller 329 fits into the second valley portion 327 when the shift range is the notP range, and fits into the first valley portion 326 when the shift range is the P range.

The parking lock mechanism 330 includes a parking rod 331, a conical member 332, a parking lock pawl 333, a shaft part 334 and a parking gear 335. The parking rod 331 is formed in a substantially L-shape. The parking rod 331 is fixed to the detent plate 321 on a side of one end 336. The conical member 332 is provided to the other end 337 of the parking rod 331. The conical member 332 is formed to reduce in diameter toward the other end 337. When the detent plate 321 pivots in the reverse rotation direction, the conical member 332 moves in a P direction.

A parking lock pawl 333 comes into contact with a conical surface of the conical member 332 and is provided so as to be swingable around the shaft part 334. On the parking gear 335 side of the parking lock pawl 333, a protrusion 338 that can mesh with the parking gear 335 is provided. When the detent plate 321 rotates in the reverse rotation direction and the conical member 332 moves in a P direction, the parking lock pawl 333 is pushed up, and the protrusion 338 meshes with the parking gear 335. On the other hand, when the detent plate 321 rotates in the forward rotational direction and the conical member 332 moves in a NotP direction, the engagement between the protrusion 338 and the parking gear 335 is released.

The parking gear 335 is provided to an axle (not shown) and is enabled to mesh with the protrusion 338 of the parking lock pawl 333. When the parking gear 335 meshes with the protrusion 338, a rotation of the axle is restricted. When the shift range is the NotP range, the parking gear 335 is not locked by the parking lock pawl 333 and the rotation of the axle is not restricted by the parking lock mechanism 330. When the shift range is the P range, the parking gear 335 is locked by the parking lock pawl 333 and the rotation of the axle is restricted.

In the above configuration, the detent plate 321 of the shift range switching mechanism 320 is provided with the detection body 200 so that the magnetic field changes according to the rotation of the output shaft 311.

The detection body 200 is formed by pressing a plate member made of a magnetic material. The detection body 200 may be a separate member from the detent plate 321. Alternatively, the detection body 200 may be formed by pressing on the detent plate 321 for example in case that the detent plate 321 is a magnetic material.

As described above, the detection body 200 can be provided on the detent plate 321 of the shift range switching mechanism 320.

Third Embodiment

In the present embodiment, the configurations different from the respective embodiments described above will be described. In the present embodiment, the signal processing unit 102 has a determination function and a diagnosis function.

The determination function is a function in which the signal processing unit 102 inputs the detection signal from the detecting unit 101, determines the position of the detection body 200 by comparing the detection signal and the determination criteria, and outputs the determination result for each output cycle. The determination criteria are threshold values for determining the positions corresponding to each of the region portions 201 to 203. As in the first embodiment, the signal processing unit 102 identifies the positions of the region portions 201 to 203 based on the combination of magnitude relationships between the detection signal and the threshold value.

The diagnosis function is a function of diagnosing whether the determination of the position corresponding to each of the region portions 201 to 203 is a normal determination or an abnormal determination for each diagnostic cycle. The diagnostic function can be realized, for example, by configuring the position sensor 100 as a duplex system. That is, the position sensor 100 is provided with two detecting units 101 having the same configuration and two determination circuit units (not shown) having the same configuration. The signal processing unit 102 compares the determination results of the two determination circuit units, determines that the determination is normal when the determination results match, and determines that the determination is abnormal when the determination results differ.

Here, the diagnostic cycle and the output cycle are set to coincide with each other. Therefore, the signal processing unit 102 outputs the diagnosis result to the external device at an output cycle corresponding to the cycle following the cycle in which the diagnosis was performed.

Next, an operation of the position sensor 100 will be described. First, the position sensor 100 starts a diagnosis when activated. After starting the diagnosis, the position sensor 100 shifts from the activated state to the state of outputting the position.

That is, the detecting unit 101 generates a detection signal corresponding to the current position of the detection body 200 based on changes in the magnetic field received from the detection body 200. The detecting unit 101 outputs the detection signal to the signal processing unit 102.

Figure 8:
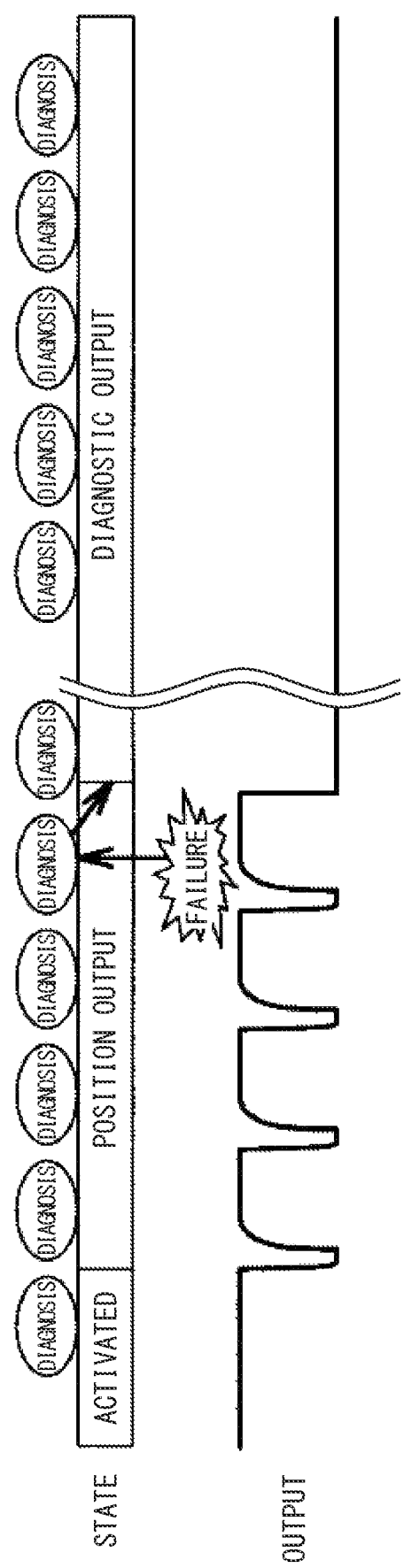
FIG. 8 is a diagram showing an output state when a failure occurs according to a third embodiment.

The signal processing unit 102 determines the current position of the detection body 200 from the detection signal input from the detecting unit 101 based on determination criteria. Further, as shown in FIG. 8, the signal processing unit 102 diagnoses the determination result based on the circuit of the duplex system.

Then, when the signal processing unit 102 diagnoses that the determination result of the position is a normal determination, the signal processing unit 102 outputs a position determination result including the information indicating the normal determination in the output cycle corresponding to the cycle next to the cycle in which the normal determination was made in the diagnostic cycle. Alternatively, the signal processing unit 102 outputs only the position determination result.

On the other hand, when a failure or the like occurs, the signal processing unit 102 diagnoses that the position determination result is an abnormality determination. In this case, the signal processing unit 102 performs a diagnostic output indicating that the abnormality determination has occurred in the output cycle corresponding to the cycle following the cycle in which the abnormality determination was diagnosed in the diagnostic cycle. The signal processing unit 102 does not output the position determination result when transitioning to the state of the diagnostic output.

As described above, since the diagnosis cycle and the output cycle are set to coincide with each other, the diagnosis result can be output in the period following the diagnosis. Therefore, the diagnosis result can be output after just one cycle without waiting for a certain period of time. Therefore, it is possible to notify the occurrence of an abnormality at an early stage when it is diagnosed as an abnormality determination.

Further, by performing failure detection every cycle, it is possible to quickly and accurately determine whether or not the detection body 200 is missing. That is, more accurate abnormality determination can be performed early.

The present disclosure is not limited to the aforementioned embodiments, and various changes can be made thereto as will be described hereinafter, without departing from the spirits of the present disclosure.

For example, the position sensor 100 is used not only for vehicles but also for industrial robots and manufacturing facilities as a sensor detecting the positions of movable components.

Although the present disclosure has been described in accordance with the examples, it is to be understood that the disclosure is not limited to such examples or structures. The present disclosure encompasses various modifications and variations within the scope of equivalents. In addition, while the various combinations and configurations, which are preferred, other combinations and configurations, including more, less or only a single element, are also within the spirit and scope of the present disclosure.

The control unit (the signal processing unit) and the technique according to the present disclosure may be achieved by a dedicated computer provided by constituting a processor and a memory programmed to execute one or more functions embodied by a computer program. Alternatively, the control circuit described in the present disclosure and the method thereof may be realized by a dedicated computer configured as a processor with one or more dedicated hardware logic circuits. Alternatively, the control circuit and method described in the present disclosure may be realized by one or more dedicated computer, which is configured as a combination of a processor and a memory, which are programmed to perform one or more functions, and a processor which is configured with one or more hardware logic circuits. The computer programs may be stored, as instructions to be executed by a computer, in a tangible non-transitory computer-readable medium. The present disclosure is not limited to the above embodiment, and various modifications may be implemented without departing from the spirit of the present disclosure.

What is claimed is:

1. A position sensor, comprising:
a detecting circuit including a magnet configured to generate a bias magnetic field and a detection circuit to which the bias magnetic field is applied, and configured to generate a detection signal corresponding to a plurality of ranges aligned in one direction along a moving direction of a detection body based on a change in the magnetic field constantly received by the detection circuit from the detection body made of a magnetic material as the detection body moves; and
a signal processing circuit configured to acquire a detection signal from the detecting circuit, compare the detection signal with a threshold value, and identify a position of the detection body as a position of any one of a plurality of ranges based on a combination of a magnitude relationship between the detection signal and the threshold value,
wherein
the detection body has a plurality of region portions corresponding to the plurality of ranges,
the plurality of region portions are configured to be connected stepwise in the moving direction of the detection body within a plane of a detection surface facing the detecting circuit of the detection body,
when the detection body is missing, the signal processing circuit determines a missing of the detection body by acquiring a detection signal obtained by not receiving any influence of the magnetic field from the detection body, and
the detection circuit is a circuit whose resistance value changes based on the change in the magnetic field received from the detection body as the detection body moves.

2. The position sensor according to claim 1, wherein
the signal processing circuit has a determination function configured to input the detection signal from the detecting circuit, determine the position of the detection body by comparing the detection signal with a determination criteria, and output a determination result for each output cycle, and a diagnostic function configured to diagnose whether the determination of the position of the detection body is normal or abnormal at each diagnostic cycle, the diagnostic cycle and the output cycle coincide with each other, and the signal processing circuit performs a diagnostic output indicating that the abnormality determination has occurred in the output cycle corresponding to the cycle following the cycle in which the abnormality determination was diagnosed in the diagnostic cycle.

3. The position sensor according to claim 1, wherein the detection body is a movable part that moves in conjunction with an operation of a shift position of a vehicle.

4. The position sensor according to claim 2, wherein the detection body is a movable part that moves in conjunction with an operation of a shift position of a vehicle.

5. A method for determining whether a detection body is missing using a position sensor, wherein the position sensor has a magnet that generates a bias magnetic field and a detection circuit to which the bias magnetic field is applied from the magnet and whose resistance value changes based on a change in the magnetic field received from the detection body as the detection body moves, the detection body has a plurality of region portions corresponding to the plurality of ranges, and the plurality of region portions are configured to be connected stepwise in the moving direction of the detection body within a plane of a detection surface facing the detection circuit of the detection body, the method for determining whether a detection body is missing, comprising the steps of:

generating a detection signal corresponding to a plurality of ranges aligned in one direction along the direction of movement of the detection body based on changes in the magnetic field that the detection circuit constantly receives from the detection body as the detection body moves;

comparing the acquired detection signal with a threshold value;

identifying a position of the detection body as a position in one of the plurality of ranges based on a combination of a magnitude relationship between the detection signal and the threshold value; and when the detection body is missing, obtaining a detection signal that is not affected by the magnetic field from the detection body at all, thereby determining whether the detection body is missing.

6. The method for determining whether a detection body is missing using a position sensor according to claim 5, further comprising the steps of:

determining the position of the detection body by comparing the detection signal with a determination criteria;

outputting a determination result for each output cycle;

diagnosing whether a determination of the position of the detection body is normal or abnormal at each diagnostic cycle; and in a state where the diagnostic cycle and the output cycle coincide with each other, and when the abnormality is diagnosed, diagnosing the abnormality in the output cycle corresponding to the cycle following the cycle in which the abnormality determination was diagnosed in the diagnostic cycle.

* * * * *